(12) United States Patent
Islam et al.

(10) Patent No.: US 7,958,283 B2
(45) Date of Patent: Jun. 7, 2011

(54) OBSERVING AN INTERNAL LINK VIA A SECOND LINK

(75) Inventors: Syed Islam, Chandler, AZ (US); James Mitchell, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 361 days.

(21) Appl. No.: 12/228,493

(22) Filed: Aug. 13, 2008

(65) Prior Publication Data

US 2010/0042761 A1 Feb. 18, 2010

(51) Int. Cl.
*G06F 3/00* (2006.01)
*G01R 31/28* (2006.01)

(52) U.S. Cl. ............................ 710/51; 710/305; 714/724

(58) Field of Classification Search .................... 710/33, 710/51, 52, 60, 61, 110, 305; 714/724, 731, 714/733, 734, 744
See application file for complete search history.

(56) References Cited

U.S. PATENT DOCUMENTS

| | | | |
|---|---|---|---|
| 5,568,492 A | | 10/1996 | Flint et al. |
| 5,613,144 A | * | 3/1997 | Hall et al. ....................... 712/43 |
| 5,796,746 A | | 8/1998 | Farnworth et al. |
| 6,009,488 A | | 12/1999 | Kavipurapu ................... 710/105 |
| 6,385,236 B1 | * | 5/2002 | Chen .............................. 375/224 |
| 6,825,683 B1 | | 11/2004 | Berndt et al. |
| 6,826,100 B2 | * | 11/2004 | Ellis et al. ...................... 365/201 |
| 6,975,954 B2 | * | 12/2005 | Mak et al. ....................... 702/118 |
| 7,139,957 B2 | * | 11/2006 | Querbach et al. .............. 714/745 |
| 7,437,643 B2 | * | 10/2008 | Khanna et al. .................. 714/733 |
| 7,500,164 B2 | * | 3/2009 | Chelstrom et al. ............ 714/729 |
| 7,525,723 B2 | | 4/2009 | Dabral |
| 7,633,877 B2 | * | 12/2009 | Sharma et al. ................. 370/241 |
| 2004/0117709 A1 | * | 6/2004 | Nejedlo et al. ................ 714/738 |
| 2006/0224815 A1 | * | 10/2006 | Yamada et al. ..................... 711/6 |
| 2007/0226482 A1 | * | 9/2007 | Borkar et al. .................. 713/100 |
| 2007/0237527 A1 | * | 10/2007 | Dabral et al. .................. 398/183 |
| 2007/0261033 A1 | * | 11/2007 | Chen et al. ..................... 717/130 |
| 2008/0005537 A1 | * | 1/2008 | Apparao et al. ............... 712/220 |
| 2008/0005621 A1 | * | 1/2008 | Bedwani et al. ................ 714/43 |
| 2008/0074992 A1 | * | 3/2008 | Sams et al. ..................... 370/216 |
| 2008/0122463 A1 | | 5/2008 | Dabral |
| 2008/0163034 A1 | * | 7/2008 | Tate et al. ...................... 714/799 |
| 2009/0172243 A1 | * | 7/2009 | Champagne et al. ............. 711/3 |

FOREIGN PATENT DOCUMENTS

| | | |
|---|---|---|
| EP | 1 580 810 | 9/2005 |
| WO | 2005069025 | 7/2005 |
| WO | 2006061668 | 6/2006 |

OTHER PUBLICATIONS

Great Britain Patent Office, Combined Search Report and Office Action for British Application No. GB0913869.4, dated Dec. 21, 2009, 7 pgs.
Chinese Patent and Trademark Office, First Office Action mailed Oct. 8, 2010 in Chinese patent application No. 200910165766.4.

* cited by examiner

*Primary Examiner* — Khanh Dang
(74) *Attorney, Agent, or Firm* — Trop, Pruner & Hu, P.C.

(57) ABSTRACT

In one embodiment, the present invention includes a method for selecting first data received in a first die of a multi-chip package (MCP) from a second die of the MCP via an intra-package link for output from a selector during a first clock period of a first clock signal, selecting second data transmitted from the second die to the first die for output from the selector during a second clock period, and transmitting the first and second data from the MCP via an external link. Other embodiments are described and claimed.

16 Claims, 4 Drawing Sheets

OBSERVING AN INTERNAL LINK VIA A SECOND LINK

BACKGROUND

A multi-chip package (MCP) includes two or more silicon die adapted in a single package. Sometimes the chips in a single package communicate with each other using a standard serial interface like a Peripheral Component Interconnect Express™ interconnect in accordance with the PCI Express™ Specification Base Specification version 2.0 (published Jan. 17, 2007) (hereafter the PCIe™ Specification) or another such protocol. These interfaces would typically be externally visible (i.e., outside the package) if the dies were packaged individually. However in an MCP as these interfaces are not coupled to the external package, the visibility of the interfaces is lost at the package level. One solution is to provide dedicated pins on the package to enable observability of these interfaces to the external world, e.g., for post-silicon debug. Considering the differential nature of these interfaces, sometimes 50-100 dedicated pins are needed on the package to obtain complete visibility. Another option is to provide bumps on the top of the package to enable interconnection with this internal link. The former solution can raise the complexity of routing of interconnection pins, while the latter solution can mandate the need for additional layers of the die. Either option increases the amount of connections and package real estate and thus raises costs.

DETAILED DESCRIPTION

Embodiments provide a hardware implementation to be integrated in a silicon component to deliver visibility using an existing external interface from a MCP, e.g., via a PCIe™ or other interconnect. In various implementations, information from a first internal link can be tapped off and forwarded through a second existing interface to the external world. The transmit side of the existing interface can be coupled to a standard logic analyzer to monitor the internal symbols flowing through the internal interface.

Figure 1:
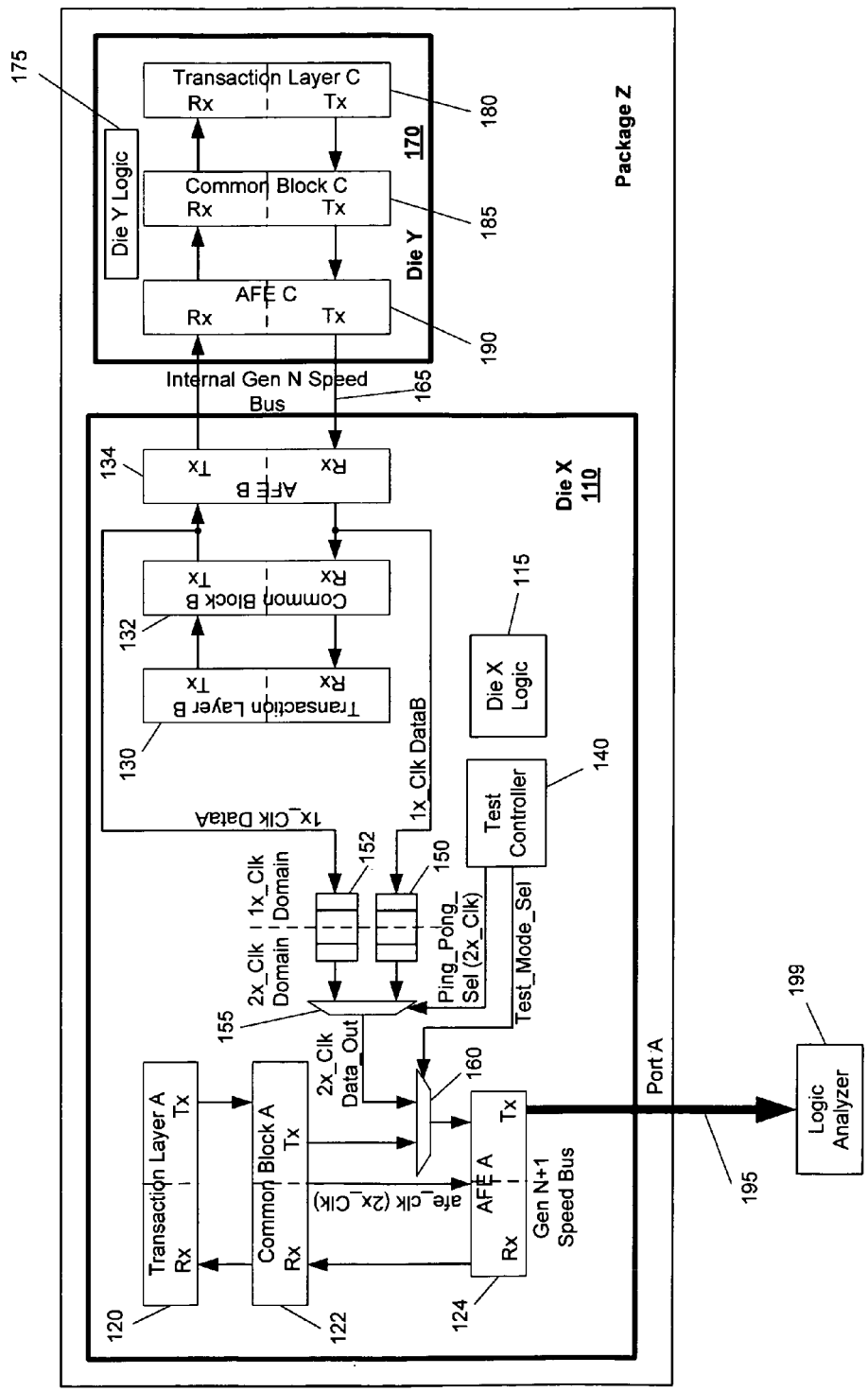
FIG. 1 is a block diagram of a multi-chip package in accordance with an embodiment of the present invention.

Referring now to FIG. 1, shown is a block diagram of a multi-chip package (MCP) 100 in accordance with an embodiment of the present invention. As shown in FIG. 1, MCP 100 includes a first die 110 and a second die 170. The two die can be coupled via an internal link 165. While the present invention is not limited in this regard, in one embodiment internal link 165 may be a PCIe™ link. For example, the PCI link may be of an N generation and which may have a corresponding link speed of 1× that in one embodiment may be 2.5 gigabits per second (Gbps). In contrast, off-chip communications via a second link 195, which in one embodiment may be a PCIe™ link of a later generation, e.g., N+1, may have a speed of 2×.

As shown, each die may include various logic to perform the desired functionality of the die. In various embodiments one or both of die 110 and 170 may be processors, controllers, memory interfaces, chipsets, or so forth. In one embodiment, die 110 may be a multi-core processor including multiple processors, cache memories, a graphics engine, input/output (I/O) interfaces and so forth. In the same embodiment, die 170 may be a chipset including interface functionality to enable communication with a system memory, a display, and one or more other peripheral devices. As shown in FIG. 1, first die 110 may include logic 115, which may be dedicated logic, such as one or more cores of a processor, controller logic or so forth.

In addition, first die 110 includes multiple interfaces or protocol stacks, one of which to enable communication off-package and a second of which to enable intra-package communication. Specifically, first die 110 includes a first interface including a transaction layer 120, a common block 122 and an analog front end (AFE) 124. This interface may operate at the 2× clock speed. As shown, each of these layers or units includes a receive (RX) portion and a transmit (TX) portion. Transaction layer 120 may, in the transmit direction, receive data to be transmitted from first die 110 and generate one or more transaction layer packets (TLPs) which include the data, along with various header and other information dictated by a given protocol. In turn, common block 122 receives this data and appends other information to provide for reliability of transmission, such as various link protocol information including, for example, error correction information, parity information, routing information or so forth. Finally, AFE 124 operates to take the digital information and prepare the packets for physical transmission via link 195. In one embodiment, AFE 124 may include transmitter circuitry such as drivers or so forth to receive the link packets from common block 122 and transmit serial bits, e.g., on a given number of lanes of the interconnect. In one embodiment, AFE 124 may condition the data for transmission via link 195, such as converting the data into differential signals, such as low voltage differential signals (LVDS) for transmission. In the receive direction, AFE 124 may receive incoming signals and convert the differential signals to link packets for transmission to common block 122. Further, AFE 124 may include in the receive direction a so-called clock and data recovery (CDR) circuit to further recover a clock transmitted with the data. In the receive direction, common block 122 may perform various processing on the data and pass TLPs onto transaction layer 120, which may extract the received data and pass it on to further circuitry within first die 110, e.g., die logic 115.

To enable communication between first die 110 and second die 170, a second protocol stack or interface is also present within first die 110 including a transaction layer 130, a common block 132, and an AFE 134, and may operate similarly to that described above for the first interface. However, in certain embodiments this interface may operate at the 1× clock speed. Again, these layers or blocks of the interface are separated into transmit and receive portions.

To enable post-silicon debug or other testing operations, data along internal link 165 may be provided out of MCP 100 via second link 195. Thus as shown in FIG. 1, data from both the receive and transmit paths of the internal interface (with regard to first die 110) may be provided to a multiplexer 155. Note that transmit data (from first die 110) may be coupled to multiplexer 155 through a synchronizer 152 to cross from a 1× clock domain to a 2× clock domain, while receive data (i.e., from second die 170) may be coupled through an elastic buffer 150 and then to multiplexer 155.

Note the clock crossing between the two clock domains, namely a 1× clock domain and a 2× clock domain. While shown in FIG. 1 with an arbitrary dashed line, understand that the external interface of first die 110 coupled to external link 195 may operate at the 2× clock domain, while the internal interface including transaction layer 130, common block 132 and AFE 134 may operate at the 1× clock domain. Thus data written into elastic buffer 150 and synchronizer 152 is according to the 1× clock domain, which is recovered from the incoming data via AFE 134. Elastic buffer 150 thus can be read using the 2× clock domain. Essentially, the reference clock of the 2× clock domain is used to provide a read pointer to elastic buffer 150, while the reference clock of the 1× clock domain is used to provide a write pointer to elastic buffer 150. Elastic buffer 150 may also act to compensate for, any skew between the clocks.

Still referring to FIG. 1, first multiplexer 155 is coupled to a second multiplexer 160. As shown, in addition to the test data provided to multiplexer 160, outgoing data from common block 122 is also provided to multiplexer 160. Both multiplexers may be controlled by a test controller 140, which provides a select signal to each of the multiplexers, namely a Ping_Pong_Sel signal to first multiplexer 155 and a Test_Mode_Sel signal to second multiplexer 160. Note that AFE 124 is clocked according to a clock received from common block 122.

Test controller 140 may include a register set that can be accessed externally, e.g., via a test access port (TAP) controller. Test controller 140 may further include hardware, software, or firmware to provide controllability to monitor various operational modes of the package. For example, control may be enabled to monitor just the transmit side or the receive side. Thus test controller 140 may provide for flexibility to enable different test modes. In some embodiments, test controller 140 may operate under limited control from an external source such as a logic analyzer, while in other embodiments greater control, e.g., via control of the internal register set, can be accommodated under limited control of an external source. As one example, a ping-pong pattern can be controlled such that a data pattern provided out of the package includes interleaved transmit and receive data.

As further shown in FIG. 1, second die 170 may include its own dedicated die logic 175 which in one embodiment may be interface circuitry, controller circuitry, memory control circuitry, one or more processor cores or so forth. In addition, a protocol stack or interface is also present, including a transaction layer 180, a common block 185, and an AFE 190, which may also operate at the 1× clock domain. While shown with this particular implementation in the embodiment of FIG. 1, the scope of the present invention is not limited in this regard.

Figure 2:
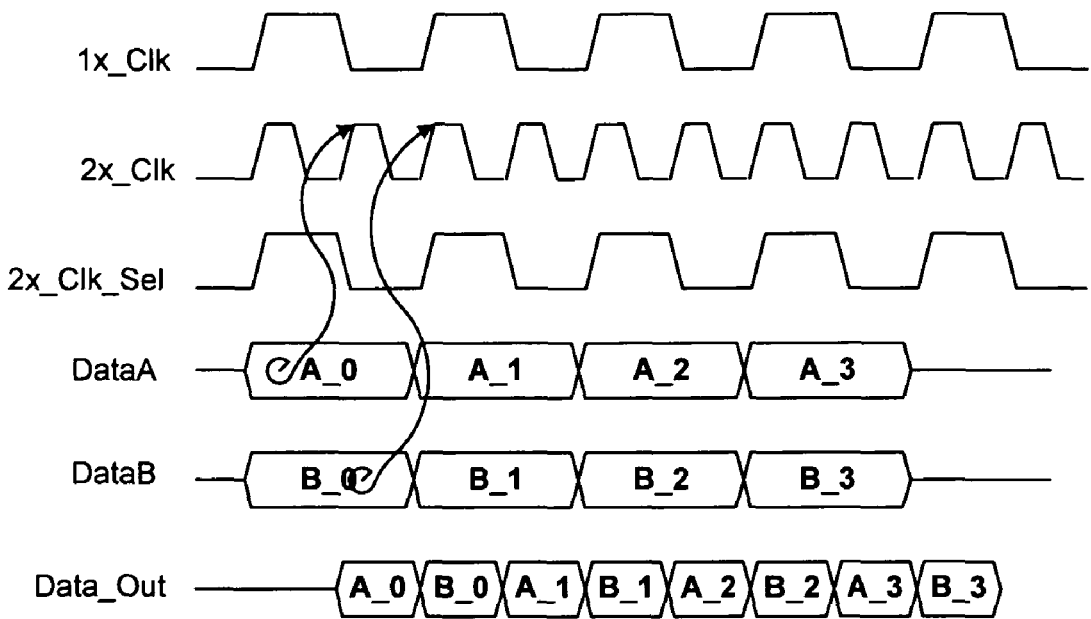
FIG. 2 is a timing diagram illustrating operation in a test mode in accordance with one embodiment of the present invention.

Referring now to FIG. 2, shown is a timing diagram illustrating operation in a test mode in accordance with one embodiment of the present invention. As shown in FIG. 2, two different clock domains are present, as discussed above. The clock signals for the two domains are shown in the first two rows of FIG. 2, namely 1×_Clk and 2×_Clk signals. In one embodiment, second die 170 may operate at the 1× clock rate and first die 110 may operate at the 2× clock rate, although the logic of these die may operate according to clocks independent of the 1× and 2× clock signals. Due to the different clock domains, at least a portion of first die 110 (i.e., the internal interface and the write control for elastic buffer 150) can be controlled to operate at the first clock rate, using a clock recovered from incoming data from second die 170. Such operation is described further below.

To enable the communication of both incoming and outgoing data during test mode (i.e., Data A and Data B), the Ping_Pong_Sel signal may be provided from test controller 140 to first multiplexer 155. In this way, the output data from first multiplexer 155 (Data_Out) may be provided via second link 195 to, e.g., a test logic analyzer 199. During this test mode, the Test_Mode_Sel signal (not shown in FIG. 2) may enable second multiplexer 160 to provide the test data output from first multiplexer 155 to AFE 124. However, during normal operation the opposite control of second multiplexer 160 is provided such that the data from common block 122 is provided to AFE 124.

Thus as illustrated in FIGS. 1 and 2, for the case when symbols are being transmitted from AFE 134 Tx side to AFE 190 Rx side, the transmitted symbols are collected by tapping off symbols from the interface between common block 132 and AFE 134 (i.e., Data A). The Data A (at the 1× clock rate) is pushed through the first and second multiplexers to AFE 124 Tx side.

For the case when symbols are being transmitted from AFE 190 Tx side to the AFE 134 Rx side, the transmitted symbols are collected by tapping off symbols from the interface between AFE 134 and common block 132. The Data B (at the 1× clock rate) is pushed through elastic buffer 150 and the first and second multiplexers to AFE 124 Tx side. Elastic buffer 150 is used to adjust for minor clock phase variation between the recovered clock at AFE 124 used to clock the incoming symbols into elastic buffer 150 and the locally-generated clock "afe_clk" (2×_clk) is used to clock data out of elastic buffer 150.

Note that test controller 140 controls both multiplexer selects (Ping_Pong_Sel and Test_Mode_Sel). The "Ping_Pong_Sel" can be controlled to operate in ping-pong fashion between Data A and Data B or to select either Data A or B. The "Test_Mode_Sel" selects either regular symbol transmission from common block 122 and AFE 124 or the "Data_Out" data (i.e., internal PCIe™ data). When "Test_Mode_Sel" is asserted, "Data_Out" will be transmitted through the AFE 124 Tx side.

Thus using an embodiment of the present invention, visibility of the internal PCIe™ interface can be achieved without the need for use of additional pins, ports or other external interfaces over an existing interface. Thus embodiments avoid the need for dedicated ports or top-side custom probing solutions on the package to observe the internal serial bus-based interface. While shown with this particular implementation in the embodiment of FIGS. 1 and 2, the scope of the present invention is not limited in this regard. For example in other embodiments, a MCP may include more than two die, with communications along internal links between them all transmitted from the package over a single external link.

Figure 3:
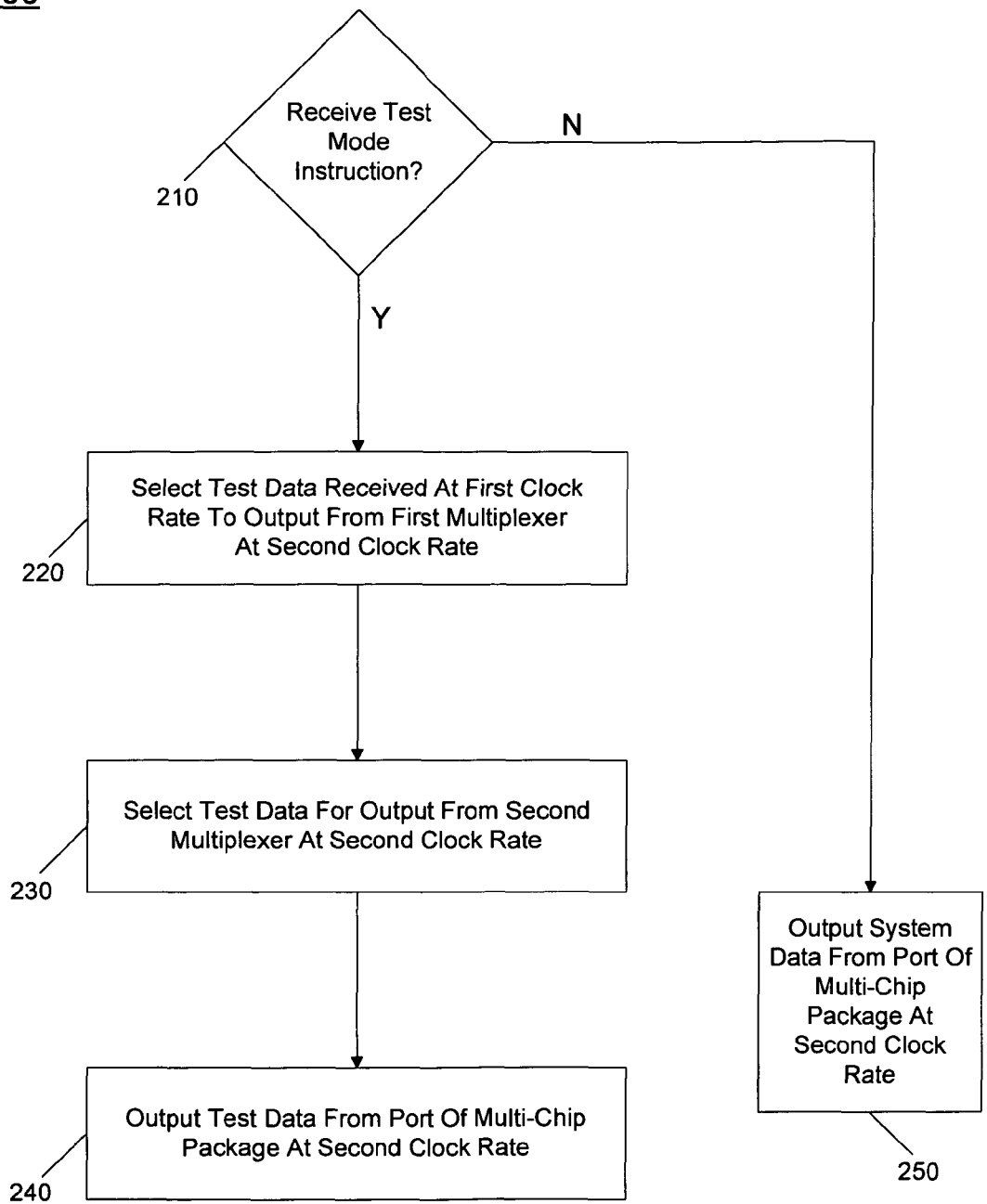
FIG. 3 is a flow diagram of a method in accordance with one embodiment of the present invention.

Referring now to FIG. 3, shown is a flow diagram of a method in accordance with one embodiment of the present invention. Method 200 shown in FIG. 3 may be implemented, e.g., by a test controller such as test controller 140 of FIG. 1, to enable transmission of internal communications on an internal link during test mode via an external link of a multi-chip package. As shown in FIG. 3, method 200 may begin by determining whether a test mode instruction has been received (diamond 210). While the scope of the present invention is not limited in this regard, such a test mode instruction may be received from software, e.g., test software of a logic analyzer, although the scope of the present invention is not limited in this regard. If no such test mode instruction is received, normal system mode operation is enabled such that data from the primary external protocol interface may be provided so that system (i.e., non-test mode) data is output at a second clock rate (block 250). As discussed above, in one embodiment the second clock rate may be at a clock rate of this external link, which may be at a higher frequency than the rate of an internal link between multiple die within the package.

Still referring to FIG. 3, if instead it is determined that a test mode instruction is received, control passes to block 220 where test data may be selected to be output from a first multiplexer at the second clock rate. This first multiplexer may receive as inputs both transmit and receive data from the internal link, where at least the receive data is at a first clock rate. Depending on the test mode instruction and the desired test data to be received by, e.g., a logic analyzer, the first multiplexer may be controlled in ping-pong fashion such that both transmit and receive data is selected, in interleaved fashion such that both data streams, received in the first multiplexer at the first clock rate, are output from the first multiplexer at the second clock rate. Alternately, only data of a single direction may be selected, based on desired debug operations.

From block 220 control passes to block 230, where the test data may be selected for output from the second multiplexer at the second clock rate. Thus the test controller controls the second multiplexer such that the test data is output, rather than normal system data. As such, at block 240 the test data may be output from the external port of the multi-chip package at the second clock rate. While shown with this particular implementation in the embodiment of FIG. 3, understand the scope of the present invention is not limited in this regard.

Figure 4:
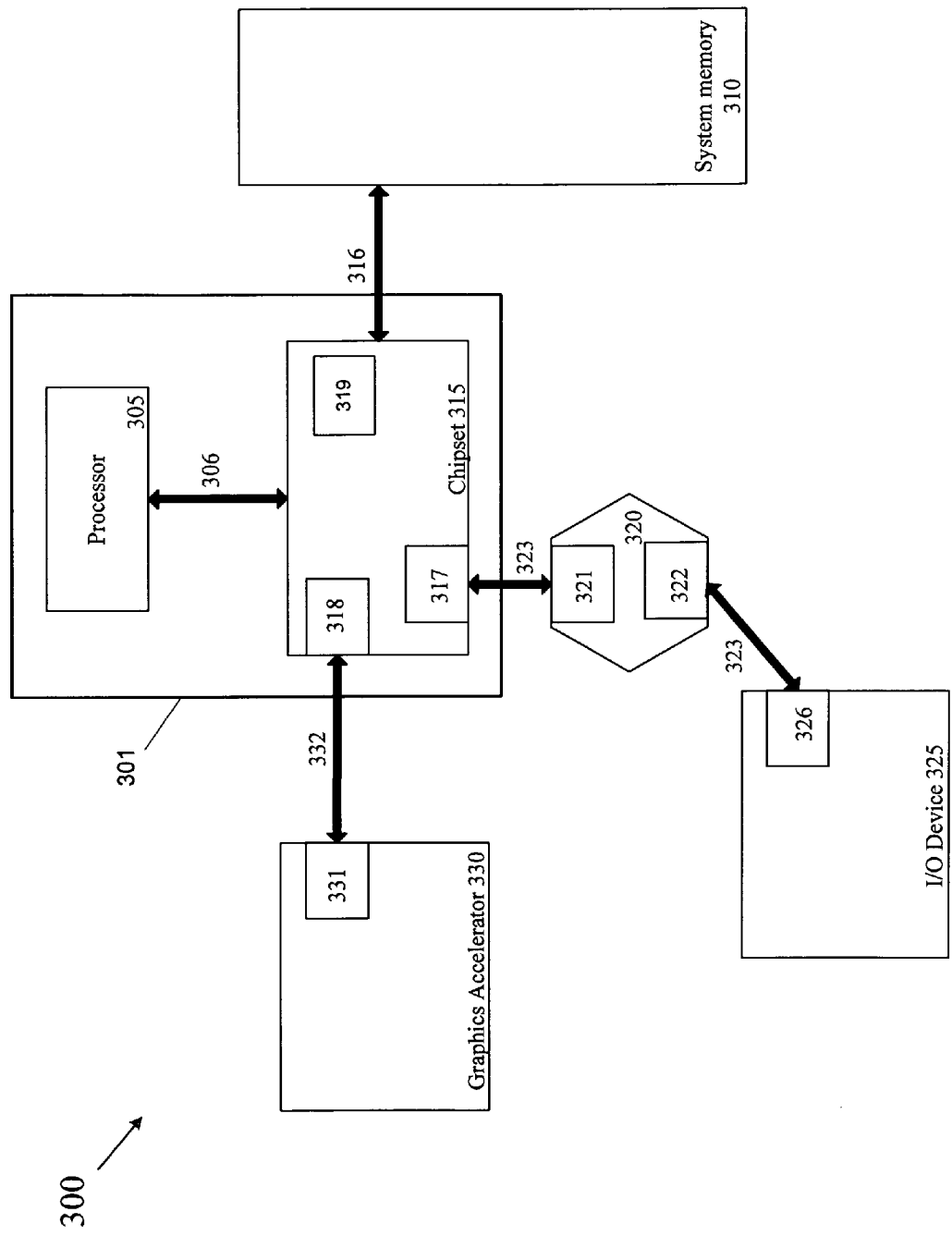
FIG. 4 is a block diagram of a system in accordance with one embodiment of the present invention.

Embodiments can be implemented in many different system types. Referring to FIG. 4, shown is a block diagram of a system in accordance with one embodiment of the present invention. System 300 includes a MCP 301 including a processor 305, which may be a multi-core processor having multiple cores to independently execute instructions, and a chipset 315, each of which may be separate die and coupled via an intra-package link 306, which in one embodiment may be a serial point-to-point (PtP) interconnect such as a PCIe™ link. Via one of modules 317-319, testing or debug of MCP 301 can occur such that intra-package communications via link 306 can be provided out of one of the modules, e.g., to a connected logic analyzer or other test equipment. While not shown for ease of illustration, chipset 315 may include a test controller and multiple structures such as shown in FIG. 1. Thus in this embodiment, the external link from MCP 301 is via chipset 315 rather than processor 305, in contrast to the embodiment of FIG. 1 in which first die 110 including the external interface may be the processor device. As further shown, system 300 includes a system memory 310 coupled to chipset 315. System memory 310 includes any memory device, such as random access memory (RAM), non-volatile (NV) memory, or other memory accessible by devices in system 300. System memory 310 is coupled to chipset 315 through a memory interface 316.

Chipset 315 may include a memory controller hub (MCH), a northbridge, an input/output controller hub (ICH) a southbridge, and root controller/hub among other such interfaces. Here, chipset 315 is coupled to a switch/bridge 320 through a serial link 323. Input/output modules 317 and 321, which may also be referred to as interfaces/ports 317 and 321, include/implement a layered protocol stack to provide communication between chipset 315 and switch 320. In one embodiment, multiple devices are capable of being coupled to switch 320.

Switch 320 routes packets/messages from a device 325 upstream, i.e., up a hierarchy towards chipset 315 and downstream, i.e., down a hierarchy away from chipset 315 to device 325. IO modules 322 and 326 implement a layered protocol stack to communicate between switch 320 and device 325 via a serial link 327. Device 325 includes any internal or external device or component to be coupled to an electronic system, such as an IO device, a network interface controller (NIC), an add-in card, an audio processor, a network processor, a hard-drive, a storage device, a monitor, a printer, a mouse, a keyboard, a router, a portable storage device, a Firewire device, a Universal Serial Bus (USB) device, a scanner, and other input/output devices.

A graphics accelerator 330 is also coupled to chipset 315 through serial link 332. In one embodiment, graphics accelerator 330 is coupled to an MCH, which is coupled to an ICH. IO modules 331 and 318 are also to implement a layered protocol stack to communicate between graphics accelerator 330 and chipset 315.

Embodiments may be implemented in code and may be stored on a storage medium having stored thereon instructions which can be used to program a system to perform the instructions. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a package including:
a first die to perform operations on data, the first die including a first interface to enable communication between the package and an external link and a second interface to enable communication between the first die and a second die within the package via an intra-package link, a test controller to enable transmission of an intra-package communication, a first multiplexer having a first input coupled to a transmit portion of the second interface and a second input coupled to a receive portion of the second interface, and a second multiplexer having a first input coupled to an output of the first multiplexer and a second input coupled to the first interface, the first and second multiplexers controlled by the test controller; and
the second die coupled to the first die via the intra-package link and including a third interface to enable communication between the first die and the second die via the intra-package link, wherein the first die is to transmit intra-package communication along the intra-package link from the package via the external link.

2. The apparatus of claim 1, wherein the first interface is to operate in a first clock domain at a first clock rate and the second interface is to operate in a second clock domain at a second clock rate.

3. The apparatus of claim 2, wherein the test controller is to cause the first multiplexer to output the intra-package communication at the second clock rate such that first data transmitted from the first die to the second die at the second clock rate and second data received in the first die from the second die at the second clock rate is transmitted via the external link at the first clock rate.

4. The apparatus of claim 3, wherein the first data and the second data are to be transmitted in an interleaved manner.

5. The apparatus of claim 3, wherein the first data and the second data comprise test data of a test mode, and wherein the test controller is to enable the second multiplexer to transmit system data via the external link if the test mode is not enabled.

6. A method comprising:
selecting first data received in a first die of a multi-chip package (MCP) from a second die of the MCP via an intra-package link for output from a selector during a first clock period of a first clock signal operating at a first clock rate, wherein the first data is received via the intra-package link at a second clock rate;
selecting second data transmitted from the second die to the first die for output from the selector during a second clock period of the first clock signal, the first data and the second data selected using a test controller of the first die; and
transmitting the first data and the second data from the MCP at the first clock rate via an external link.

7. The method of claim 6, further comprising transmitting the first data and the second data in a test mode of the MCP.

8. The method of claim 7, further comprising transmitting system data of the first die via the external link at the first clock rate if the test mode is not enabled.

9. The method of claim 6, further comprising storing the first data in an elastic buffer of the first die according to the second clock rate and reading the first data from the elastic buffer according to the first clock rate.

10. The method of claim 9, further comprising outputting the first data from the elastic buffer to the selector according to the first clock rate.

11. The method of claim 6, further comprising:
controlling the selector so that the first data and the second data are output from the selector in an interleaved manner; and
controlling a second selector coupled to the selector to output the first and second data in a test mode of the MCP, and otherwise controlling the second selector to output system data of the first die.

12. The method of claim 6, further comprising controlling the test controller via a logic analyzer coupled to the MCP.

13. A system comprising:
a multi-chip package (MCP) including:
a multi-core processor having a plurality of cores to independently execute instructions, the multi-core processor formed on a first die;
a chipset coupled to the multi-core processor via an internal link of the MCP, the chipset formed on a second die and including a test controller to enable test communications between the multi-core processor and the chipset, an external interface to enable communications between the MCP and an external link, and an internal interface to enable communications between the multi-core processor and the chipset via the internal link, wherein the chipset is to transmit the test communications between the multi-core processor and the chipset from the MCP via the external link under control of the test controller, the chip set further including first multiplexer having a first input coupled to a transmit portion of the internal interface and a second input coupled to a receive portion of the internal interface, and a second multiplexer having a first input coupled to an output of the first multiplexer and a second input coupled to the external interface, the first and second multiplexers controlled by the test controller; and
a dynamic random access memory (DRAM) coupled to the MCP.

14. The system of claim 13, wherein the external interface is to operate at a first clock rate and the internal interface is to operate at a second clock rate.

15. The system of claim 14, further comprising an elastic buffer coupled between the internal interface and the first multiplexer, wherein incoming data from the multi-core processor is to be stored in the elastic buffer according to the second clock rate and is to be read from the elastic buffer according to the first clock rate.

16. The system of claim 15, wherein the test controller is to transmit data from the multi-core processor and the chipset from the first multiplexer in alternating cycles at the first clock rate, wherein the data received in the internal interface from the multi-core processor and the data transmitted from the chipset via the internal interface is at the second clock rate.

* * * * *